(12) United States Patent
Sekiya et al.

(10) Patent No.: US 6,322,715 B1
(45) Date of Patent: Nov. 27, 2001

(54) GAS COMPOSITION FOR DRY ETCHING AND PROCESS OF DRY ETCHING

(75) Inventors: Akira Sekiya, Tsukuba; Toshiro Yamada; Kuniaki Goto, both of Tokyo; Tetsuya Takagaki, Tokorozawa, all of (JP)

(73) Assignees: Japan as represented by Director General of the Agency of Industrial Science and Technology; The Mechanical Social Systems Foundation; Electronics Industries Association of Japan; Nippon Zeon Co., Ltd., all of Tokyo (JP)

( * ) Notice: Subject to any disclaimer, the term of this patent is extended or adjusted under 35 U.S.C. 154(b) by 0 days.

(21) Appl. No.: 09/297,071

(22) PCT Filed: Oct. 30, 1997

(86) PCT No.: PCT/JP97/03966

§ 371 Date: Apr. 30, 1999

§ 102(e) Date: Apr. 30, 1999

(87) PCT Pub. No.: WO98/19331

PCT Pub. Date: May 7, 1998

(30) Foreign Application Priority Data

Oct. 30, 1997 (JP) .................................................. 8-305819

(51) Int. Cl.[7] .................................................. C09K 13/00
(52) U.S. Cl. .......................... 216/67; 252/79.1; 438/710
(58) Field of Search .............................. 216/67; 252/79.1; 438/710

(56) References Cited

U.S. PATENT DOCUMENTS

| | | | | |
|---|---|---|---|---|
| 4,431,477 | * | 2/1984 | Zajac | 156/643 |
| 5,338,399 | | 8/1994 | Yanagida | 156/662 |
| 5,770,098 | * | 6/1998 | Araki et al. | 216/67 |
| 6,069,092 | * | 5/2000 | Imai et al. | 437/723 |
| 6,159,862 | * | 12/2000 | Yamada et al. | 438/712 |
| 6,225,184 | * | 5/2001 | Hayashi et al. | 438/396 |
| 6,232,209 | * | 5/2001 | Fujiwara et al. | 438/585 |
| 6,242,359 | * | 6/2001 | Misra | 438/710 |

FOREIGN PATENT DOCUMENTS

| | | | |
|---|---|---|---|
| 0 517 165 A1 | 12/1992 | (EP) . | |
| 5-94974 | 4/1993 | (JP) . | |
| 5-283374 | 10/1993 | (JP) . | |
| 5-326460 | 12/1993 | (JP) . | |
| 6-177092 | 6/1994 | (JP) . | |
| 6-318575 | 11/1994 | (JP) . | |
| 4346427 A | * 12/1992 | (JP) | H01L/21/302 |

* cited by examiner

*Primary Examiner*—Randy Gulakowski
*Assistant Examiner*—Allan W. Olsen
(74) *Attorney, Agent, or Firm*—Armstrong, Westerman, Hattori, McLeland & Naughton, LLP

(57) ABSTRACT

A gaseous composition for dry etching, comprising a perfluorocycloolefin and 1 to 40% by mole, based on the perfluorocycloolefin, of at least one oxygen ingredient selected from oxygen gas and oxygen-containing gaseous compounds. As the perfluorocycloolefin, those having 3 to 8 carbon atoms, especially 4 to 6 carbon atoms, are preferably used.

10 Claims, No Drawings

GAS COMPOSITION FOR DRY ETCHING AND PROCESS OF DRY ETCHING

TECHNICAL FIELD

This invention relates to a fluorocarbon gas-containing gaseous composition for dry etching, and a dry etching process using the gaseous composition. More particularly, it relates to a gaseous composition for dry etching, and a dry etching process, by which the etching can be conducted at a high rate with good selectivity to a protective thin film such as a photoresist or a polysilicon.

BACKGROUND ART

In recent years, a rapid progress has been achieved in the field of electronics. One reason therefor exists in that extremely highly integrated semiconductor devices have been put into practice. A dry etching technique is very important for forming a fine pattern on a silicon wafer for achieving the high integration, and is constantly progressing.

In dry etching, in order to produce fluorine-containing active ingredients by plasma discharge or other means, gases of compounds containing many fluorine atoms have heretofore been used as the etching gas. As examples of the fluorine-containing etching gas, there can be mentioned highly fluorinated compounds such as carbon tetrafluoride, sulfur hexafluoride, nitrogen trifluoride, carbon trifluoromonobromide, trifluoromethane, hexafluoroethane and octafluoropropane.

International efforts for conserving the global environment are being made, and especially those for preventing or minimizing the global warming are now attracting a great interest. For example, in IPCC (Intergovernmental Panel on Climate Change), regulations on control of the total amount of carbon dioxide emission have been established in the international agreement. Under these circumstances, it is pointed that, from a viewpoint of prevention of the global warming, there is an increasing need of developing alternatives for the highly fluorinated compounds which have heretofore widely been used and which have a long life in the air and cause the global warming. More specifically, it is said that carbon tetrafluoride, hexafluoroethane and sulfur hexafluoride have a life in the air of 50,000, 10,000 and 3,200 years, respectively. These fluorinated compounds exhibit a large absorbability for infrared rays and exert a considerable influence upon the global warming. Thus, it is eagerly desired to develop an etching process utilizing a novel etching gas which does not cause the global warming and has etching performances comparable to those of the heretofore used etching gases.

Various proposals have been made for enhancing the selectivity to a protective thin film such as a photoresist or a polysilicon in a dry etching process. For example, a proposal has been made in Japanese Unexamined Patent Publication No. H4-170026 wherein a silicon compound is etched by using a gas containing an unsaturated fluorocarbon such as perfluoropropene or perfluorobutene while the temperature of the substrate to be etched is controlled to a temperature not higher than 50° C. Another proposal has been made in Japanese Unexamined Patent Publication no. H4-258117 wherein etching is effected in a manner similar to the above proposal by using a gas containing a cyclic saturated or cyclic unsaturated fluorocarbon such as perfluorocyclopropane, perfluorocyclobutane, perfluorocyclobutene or perfluorocyclopentene, while the temperature of the substrate to be etched is controlled to a temperature not higher than 50° C.

However, the dry etching techniques heretofore proposed in the above patent publications have problems such that the etching gas is not sufficiently decomposed by the plasma discharge, depending upon the particular dry etching conditions, to polymerize on the substrate whereby a polymer deposition in the form of a brown thin film is produced on the substrate, and further that the rate of etching is not high and the selectivity to a protective thin film such as a photoresist or a polysilicon is low.

DISCLOSURE OF THE INVENTION

In view of the foregoing conventional techniques, an object of the present invention is to provide a gaseous composition for dry etching by which dry etching is conducted with a high selectivity to a protective thin film such as a photoresist or a polysilicon and at a high rate of etching without production of a polymer film by deposition in the etching step, and thus, good etching results are obtained.

Another object of the present invention is to provide a dry etching process by which dry etching can be industrially advantageously conducted by using the above-mentioned gaseous dry etching composition.

The inventors have continued researches into dry etching of a silicon compound by using dry etching gases containing various saturated and unsaturated, and straight chain and cyclic fluorine-containing compounds, and surprisingly, found that, when a dry etching gas composition containing octafluorocyclopentene is used, and a small amount of oxygen gas or a gaseous oxygen-containing compound is incorporated in the dry etching gas composition, satisfactory etching can be achieved at a high rate of etching with a high selectivity to a photoresist and a high selectivity to a polysilicon and without deposition of an undesirable polymer film.

In accordance with the present invention, there is provided a gaseous composition for dry etching, comprising a octafluorocyclopentene and 1 to 40% by mole, based on the octafluorocyclopentene, of at least one oxygen ingredient selected from oxygen gas and oxygen-containing gaseous compounds.

In accordance with the present invention, there is further provided a dry etching process, characterized in that dry etching is conducted by using a gaseous composition comprising a octafluorocyclopentene and 1 to 40% by mole, based on the octafluorocyclopentene, of at least one oxygen ingredient selected from oxygen gas and oxygen-containing gaseous compounds.

BEST MODE FOR CARRYING OUT THE INVENTION

The gaseous composition for dry etching used in the present invention is characterized by containing octafluorocyclopentene. When octafluorocyclopentene is used, the etching rate and the selectivity are sufficiently high, and there is no problem of polymer deposition and volatility.

In the present invention, a perfluorocarbon selected from perfluorocycloolefins other than octafluorocyclopentene, straight chain unsaturated perfluorocarbons, and perfluoroalkanes and perfluorocycloalkanes may be used, in combination with octafluorocyclopentene. However, if these optional perfluorocarbons are used in a salient amount, the object of the present invention cannot be achieved. Therefore, the amount of these perfluorocarbons is usually not larger than 30% by weight, preferably not larger than 20% by weight and more preferably not larger than 10% by weight, based on the total amount of the fluorocarbons.

In the gaseous composition for dry etching, at least one oxygen ingredient selected from oxygen gas and oxygen-containing gaseous compounds is contained in addition to octafluorocyclopentene. The term "oxygen-containing gaseous compounds" used herein we mean oxygen-containing compounds which are gaseous under the etching conditions employed. As specific examples of the oxygen-containing gaseous compounds, there can be mentioned carbon oxide gas such as carbon monoxide and carbon dioxide, nitrogen oxide gas, and sulfur oxide gas. Of the oxygen ingredients, oxygen gas is preferable. By using a dry etching gas containing a perfluorocycloolefin, and oxygen gas and/or an oxygen-containing gaseous compound, a higher selectivity to a photoresist and a higher selectivity to a polysilicon are obtained and etching can be conducted at a higher rate, than those attained in the case when a dry etching gas containing a perfluorocycloolefin, but, containing neither oxygen gas nor an oxygen-containing gaseous compound. The oxygen gas and the oxygen-containing gaseous compounds may be used either alone or as a combination of at least two thereof.

The amount of the oxygen ingredient is in the range of 1 to 40 moles, preferably 3 to 30 moles and more preferably 5 to 15 moles, per 100 moles of the octafluorocyclopentene. If the amount of the oxygen ingredient is too small, it becomes difficult to attain the intended high rate of etching, and the high selectivity to a photoresist and the high selectivity to a polysilicon. In contrast, if the amount of the oxygen ingredient is too large, there is a tendency such that only an oxidation reaction of the etching gas occurs under plasma-irradiated conditions, and thus, it becomes difficult to etch the substrate material to be etched.

If desired, various gases can be contained, in addition to the octafluorocyclopentene and oxygen gas and/or oxygen-containing gaseous compounds, in the gaseous composition for dry etching used in the present invention. Such gases include those which are widely used in dry etching, but, usually, an appropriate gas or its combination should be chosen depending upon the particular material of substrate to be etched. As examples of the gases, there can be mentioned nitrogen gas, argon gas, hydrogen gas and chlorine gas. These gases can be used either alone or as a combination of at least two thereof. The amount of the gas used varies depending upon the degree of influence upon the substrate material to be etched, but is usually not larger than 40 parts by weight, and preferably 3 to 25 parts by weight, based on 100 parts by weight of the octafluorocyclopentene.

A hydrofluorcarbon gas may also be contained in the gaseous composition for dry etching containing octafluorocyclopentene used in the present invention. The hydrofluorocarbon gas is contained for the purpose of adjusting the ratio in amount of fluorine atom/hydrogen atom. The hydrofluorocarbon gas used is not particularly limited provided that it is volatile. Usually, the hydrofluorocarbon gas used are selected from straight chain or branched chain or cyclic saturated hydrocarbons, of which at least half of the hydrogen atoms have been substituted by fluorine atoms. As specific examples of the saturated hydrofluorocarbon gases, there can be mentioned trifluoromethane, pentafluoroethane, tetrafluoroethane, heptafluoropropane, hexafluoropropane, pentafluoropropane, nonafluorobutane, octafluorobutane, heptafluorobutane, hexafluorobutane, undecafluoropentane, decafluoropentane, nonafluoropentane, octafluoropentane, tridecafluorohexane, dodecafluorohexane, undecafluorohexane, heptafluorocyclobutane, hexafluorocyclobutane, nonafluorocyclopentane, octafluorocyclopentane and heptafluorocyclopentane. Of these, trifluoromethane, pentafluoroethane and tetrafluoroethane are preferable. The hydrofluorocarbon gases may be used either alone or as a combination of at least two thereof.

The amount of the hydrofluorocarbon gas used varies depending upon the particular degree of influence of the hydrofluorocarbon gas upon the material of substrate to be etched, but is usually not larger than 50% by mole and preferably not larger than 30% by mole, based on the octafluorocyclopentene-containing gaseous composition for dry etching.

The substrate to be etched has a structure such that a thin film layer of a material to be etched is formed on a sheet-form substrate such as a glass sheet, a silicon monocrystal wafer or a gallium-arsenic substrate. As specific examples of the material to be etched, there can be mentioned silicon oxide, silicon nitride, aluminum, tungsten, molybdenum, tantalum, titanium, chromium, chromium oxide and gold. As preferable examples of the substrate to be etched, there can be mentioned a silicon wafer having a silicon oxide thin film or an aluminum thin film, formed thereon. In the case where a silicon oxide thin film is etched, the silicon oxide thin film preferably has a protective thin film composed of photoresist or polysilicon.

In the dry etching process of the present invention, the pressure of the above-mentioned dry etching gas composition is not particularly limited, and generally, the etching gas composition is introduced within an etching apparatus to an extent such that the inner pressure of the vacuumed etching apparatus reaches a pressure in the range of about 10 Torr to $10^{-5}$ Torr, and preferably $10^{-2}$ Torr to $10^{-3}$ Torr.

The dry etching process of the present invention can be conducted by the ordinary procedure. The temperature to which the substrate to be etched reaches is usually in the range of 0° C. to about 300° C., preferably 60° C. to 250° C. and more preferably 80° C. to 200° C. The time for the etching treatment is in the range of about 10 seconds to about 10 minutes. But, according to the process of the present invention, a high rate of etching can be attained, and thus, the etching time is preferably in the range of 10 seconds to 3 minutes in view of the productivity.

The density of a plasma, with which the substrate is irradiated when etching is conducted, is not particularly limited, and can be appropriately chosen in a range spanning from a low density region to a high density region, namely, in the range of $10^8$ ions/cm$^3$ to $10^{12}$ ions/cm$^3$.

The invention will now be described more specifically by the following examples, but, these examples by no means limit the scope of the invention.

EXAMPLES 1 and 2

A silicon wafer having a diameter of 150 mn, on a surface of which a silicon oxide ($SiO_2$) thin film was formed, was set with a parallel plate-type plasma etching apparatus ("TUE-type" made by Tokyo Ohka K. K.). The inside of the etching apparatus was vacuumed and then an etching gas composition containing octafluorocyclopentene oxygen gas in an amount shown in Table 1 was introduced into the etching apparatus at a flow rate of 50 ml/min (gas temperature: 20° C.). Etching was conducted while the silicon wafer maintained initially at 20° C. was irradiated with a plasma with a density of $10^9$ ions/cm$^3$ for 60 seconds at a gas pressure of 300 mTorr.

The etching rate was measured at five points on each wafer, namely, (i) the center, (ii) two points 35 mm apart from the center in opposite directions on a diameter, and (iii) two points 65 mm apart from the center in opposite directions on the diameter. The etching rates measured at the above-recited five points on a diameter of the wafer are referred to as etching rate-1, -2, -3, -4 and -5, respectively, in the above-recited order. The results are shown in Table 1.

The above-mentioned etching procedures were repeated on a wafer, on a surface of which a photoresist (PR) thin film or a polysilicon (Poly-Si) thin film was formed, wherein the time of irradiation with a plasma was varied to 60 sec. for PR and 15 sec. for Poly-Si with all other etching conditions remaining the same. By comparing the etching rates as measured on these PR thin film and Poly-Si thin film and the above-mentioned $SiO_2$ thin film, the selectivity to a photoresist and the selectivity to a polysilicon were evaluated. The selectivities to PR and poly-Si were calculated according to the following equation, and the results are shown in Table 1.

Selectivity =(Average etching rate on $SiO_2$)/(average etching rate on PR or poly-Si)

The life in the air of octafluorocyclopentene used as the etching gas was proved to be 1.0 year as measured on the rate of reaction with a hydroxyl radical. Thus, it was confirmed that the influence upon the global warming is extremely low. Further, the life in the air of octafluorocyclopentene was also presumed to be 0.3 year as calculated from the HOMO energy of molecule according to Atmospheric Environment, vol. 26A, No.7, p1331 (1992).

TABLE 1

|  | Example | | Comparative Example | |
| --- | --- | --- | --- | --- |
|  | 1 | 2 | 2 | 3 |
| Amount of oxygen (mole) *1 | 11 | 25 | 11 | 25 |
| Etching rate (Angstrom/min) | | | | |
| Rate-1 | 2916 | 3102 | 3909 | 2857 |
| Rate-2 | 3623 | 3413 | 4057 | 3022 |
| Rate-3 | 3037 | 2925 | 3952 | 2926 |
| Rate-4 | 3477 | 3222 | 4004 | 2974 |
| Rate-5 | 3123 | 3117 | 3950 | 2906 |
| Average rate | 3235 | 3156 | 3974 | 2937 |
| Selectivity to | | | | |
| Photoresist | 15.4 | 4.7 | 2.4 | 1.3 |
| Polysilicon | 13.6 | 3.4 | 1.6 | 1.0 |

*1 Moles per 100 moles of octafluorocyclopentene or carbon tetrafluoride

Comparative Example 1

The dry etching procedures employed in Example 1 were repeated wherein a dry etching gas composition comprising octafluorocyclopentene but not containing oxygen gas was used with all other conditions remaining the same. It was found that no etching occurs under the etching conditions employed without the addition of oxygen gas, and undesirable deposition of polymer on the wafer occur to produce a polymer film with a brown color.

Comparative Examples 2 and 3

The dry etching procedures employed in Examples 1 and 2 were repeated wherein a dry etching gas composition comprising carbon tetrafluoride, which is heretofore conventionally used, instead of octafluorocyclopentene, was used with all other conditions remaining the same. The results are shown in Table 1.

Industrial Applicability

When a dry etching is conducted by using an etching gas composition containing octafluorocyclopentene and a specific amount of oxygen gas and/or oxygen-containing gaseous compounds according to the present invention, the dry etching can be conducted at a high rate with a high selectivity to a photoresist or a polysilicon. Undesirable deposition of a polymer film upon etching can be completely avoided. Further, there is no need of cooling a wafer, and therefore, a special etching apparatus equipped with an inner cooling means connected to an outer cooling apparatus is not needed and thus the invention is industrially beneficial.

What is claimed is:

1. A gaseous composition for dry etching, which comprises (i) octofluorocyclopentene, (ii) 1 to 40% by mole, based on the octafluorocyclopentene, of at least one oxygen ingredient selected from the group consisting of oxygen gas and oxygen-containing gaseous compounds, and (iii) a saturated hydrofluorocarbon gas, in an amount not larger than 50% by mole, based on the entire gaseous composition for dry etching.

2. The gaseous composition according to claim 1, wherein the content of the oxygen ingredient is in the range of 3 to 30% by mole based the octafluorocyclopentene.

3. The gaseous composition according to claim 1, wherein the content of the oxygen ingredient is in the range of 5 to 15% by mole based the octafluorocyclopentene.

4. The gaseous composition according to claim 1, wherein the oxygen ingredient is oxygen gas.

5. The gaseous composition according to claim 1, wherein the oxygen ingredient is selected from the group consisting of a carbon oxide gas, a nitrogen oxide gas and a sulfur oxide gas.

6. The gaseous composition according to claim 1, wherein the content of the saturated hydrofluorocarbon gas is not larger than 30% by mole, based on the entire gaseous composition for dry etching.

7. The gaseous composition according to claim 1, wherein the saturated hydrofluorocarbon gas is a straight chain or branched chain or cyclic saturated hydrocarbon, of which at least half of the hydrogen atoms have been substituted by fluorine atoms.

8. A dry etching process comprising the step of conducting dry etching by using a gaseous composition as claimed in claim 1.

9. The dry etching process according to claim 8, wherein a substrate to be etched is irradiated with a plasma under conditions such that the temperature which the substrate reaches is in the range of 0° C. to 300° C., and the pressure of the gaseous composition is in the range of 10 Torr to $10^{-5}$ Torr.

10. The dry etching process according to claim 9, wherein the substrate is irradiated with a plasma with a density in the range of $10^8$ ions/cm$^3$ to $10^{12}$ ions/cm$^3$.

* * * * *